(12) United States Patent
Kim et al.

(10) Patent No.: US 8,159,261 B2
(45) Date of Patent: Apr. 17, 2012

(54) SEMICONDUCTOR CIRCUIT

(75) Inventors: Chul Kim, Ichon-shi (KR); Jong Chern Lee, Ichon-shi (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/836,544

(22) Filed: Jul. 14, 2010

(65) Prior Publication Data

US 2011/0128039 A1 Jun. 2, 2011

(30) Foreign Application Priority Data

Nov. 30, 2009 (KR) .................. 10-2009-0117230

(51) Int. Cl.
*H03K 17/16* (2006.01)
*H03K 19/003* (2006.01)
(52) U.S. Cl. ............. 326/30; 326/87; 327/109; 327/112
(58) Field of Classification Search .............. 326/30, 326/82–83, 86–87; 327/108–109, 112
See application file for complete search history.

(56) References Cited

U.S. PATENT DOCUMENTS

| | | | | |
|---|---|---|---|---|
| 6,181,157 B1 * | 1/2001 | Fiedler | ........................... | 326/30 |
| 6,836,142 B2 * | 12/2004 | Lesea et al. | ........................... | 326/30 |
| 6,963,218 B1 * | 11/2005 | Alexander et al. | ........................... | 326/30 |
| 7,012,449 B2 * | 3/2006 | Lee et al. | ........................... | 326/82 |
| 7,285,977 B2 * | 10/2007 | Kim | ........................... | 326/30 |
| 7,362,128 B2 * | 4/2008 | Choi et al. | ........................... | 326/30 |
| 7,417,452 B1 * | 8/2008 | Wang et al. | ........................... | 326/30 |
| 7,423,450 B2 * | 9/2008 | Santurkar et al. | ........................... | 326/30 |
| 7,477,083 B2 | 1/2009 | Fujisawa et al. | | |
| 7,528,626 B2 | 5/2009 | Kim | | |
| 7,586,325 B1 * | 9/2009 | Andrews et al. | ........................... | 326/32 |
| 7,902,875 B2 * | 3/2011 | Mei | ........................... | 326/87 |
| 2007/0132493 A1 | 6/2007 | Fujisawa et al. | | |
| 2007/0148796 A1 | 6/2007 | Nakamura et al. | | |
| 2008/0112246 A1 * | 5/2008 | Mei | ........................... | 365/210.1 |
| 2008/0211534 A1 | 9/2008 | Jeong et al. | | |
| 2008/0219068 A1 | 9/2008 | Kim et al. | | |
| 2008/0304336 A1 | 12/2008 | Kim et al. | | |
| 2009/0066368 A1 * | 3/2009 | Mei | ........................... | 326/83 |

FOREIGN PATENT DOCUMENTS

| | | |
|---|---|---|
| JP | 2007-116574 | 5/2007 |
| JP | 2007-123987 | 5/2007 |
| JP | 2008-219865 | 9/2008 |
| JP | 2008-228276 | 9/2008 |
| KR | 100681881 B1 | 2/2007 |
| KR | 100805696 B1 | 2/2008 |

* cited by examiner

*Primary Examiner* — Jason M Crawford
(74) *Attorney, Agent, or Firm* — William Park & Associates Ltd.

(57) ABSTRACT

A semiconductor circuit includes a pad, a pad driver connected to the pad at an output terminal thereof and configured to calibrate a voltage of the pad in response to code signals, a comparison section configured to compare a reference voltage and the voltage of the pad and generate a comparison signal, and a code generation section configured to calibrate code values of the code signals in response to the comparison signal.

35 Claims, 7 Drawing Sheets

US 8,159,261 B2

SEMICONDUCTOR CIRCUIT

CROSS-REFERENCE TO RELATED APPLICATION

The present application claims priority under 35 U.S.C. §119(a) to Korean Application No. 10-2009-0117230, filed on Nov. 30, 2009, in the Korean Intellectual Property Office, which is incorporated herein by reference in its entirety as if set forth in full.

BACKGROUND

1. Technical Field

The present invention relates to a semiconductor circuit.

2. Related Art

A voltage level of signal input/output terminals, that is, pads, of a semiconductor circuit are likely to vary from a target level due to changes in process, voltage and temperature (PVT).

This is because the impedance of the pads of the semiconductor circuit and the impedance of external circuits connected thereto are different from each other. If the impedances are different, a loss of signals to be transmitted may result.

Therefore, in the semiconductor circuit, in order to reduce the loss of transmission/reception signals, it is important to reduce a difference between the impedance of the pads and a target impedance.

SUMMARY

Various embodiments of the present invention comprise a semiconductor circuit.

In one aspect of the present invention, a semiconductor circuit comprises a pad, a pad driver connected to the pad at an output terminal thereof and configured to calibrate a voltage of the pad in response to code signals, a comparison section configured to compare a reference voltage and the voltage of the pad and generate a comparison signal, and a code generation section configured to calibrate code values to of the code signals in response to the comparison signal.

In another aspect of the present invention, a semiconductor circuit comprises a pad, a pad driver connected to the pad at an output terminal thereof and configured to calibrate a voltage of the pad in response to code signals, a first comparison section configured to compare a first reference voltage and the voltage of the pad and generate a first comparison signal, a second comparison section configured to compare a second reference voltage and the voltage of the pad and generate a second comparison signal, and a code generation section configured to calibrate code values of the code signals in response to the first comparison signal and fix code values of the code signals in response to the first comparison signal and the second comparison signal.

In another aspect of the present invention, a semiconductor circuit comprises a pad, a pad driver connected to the pad at an output terminal thereof and configured to calibrate a voltage of the pad in response to control voltages, a comparison section configured to compare a reference voltage and the voltage of the pad and generate a comparison signal, and a voltage generation section configured to calibrate levels of the control voltages in response to the comparison signal.

In another aspect of the present invention, a semiconductor circuit comprises a pad, a pad driver connected to the pad at an output terminal thereof and configured to calibrate a voltage of the pad in response to control voltages, a first comparison section configured to compare a first reference voltage and the voltage of the pad and generate a first comparison signal, a second comparison section configured to compare a second reference voltage and the voltage of the pad and generate a second comparison signal, and a voltage generation section configured to calibrate levels of the control voltages in response to the first comparison signal and fix levels of the control voltages in response to the first comparison signal and the second comparison signal.

In another aspect of the present invention, a semiconductor circuit comprises data output drivers configured to apply a predetermined voltage to a pad according to first code signals and an impedance compensation unit configured to compensate for a difference between a voltage of the pad and a reference voltage using second code signals.

In another aspect of the present invention, a semiconductor circuit comprises data output drivers configured to apply a predetermined voltage to a pad according to preset code signals and an impedance compensation unit configured to compensate for a difference between a voltage of the pad and a reference voltage using control voltages.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION OF THE EMBODIMENTS

Figure 1:
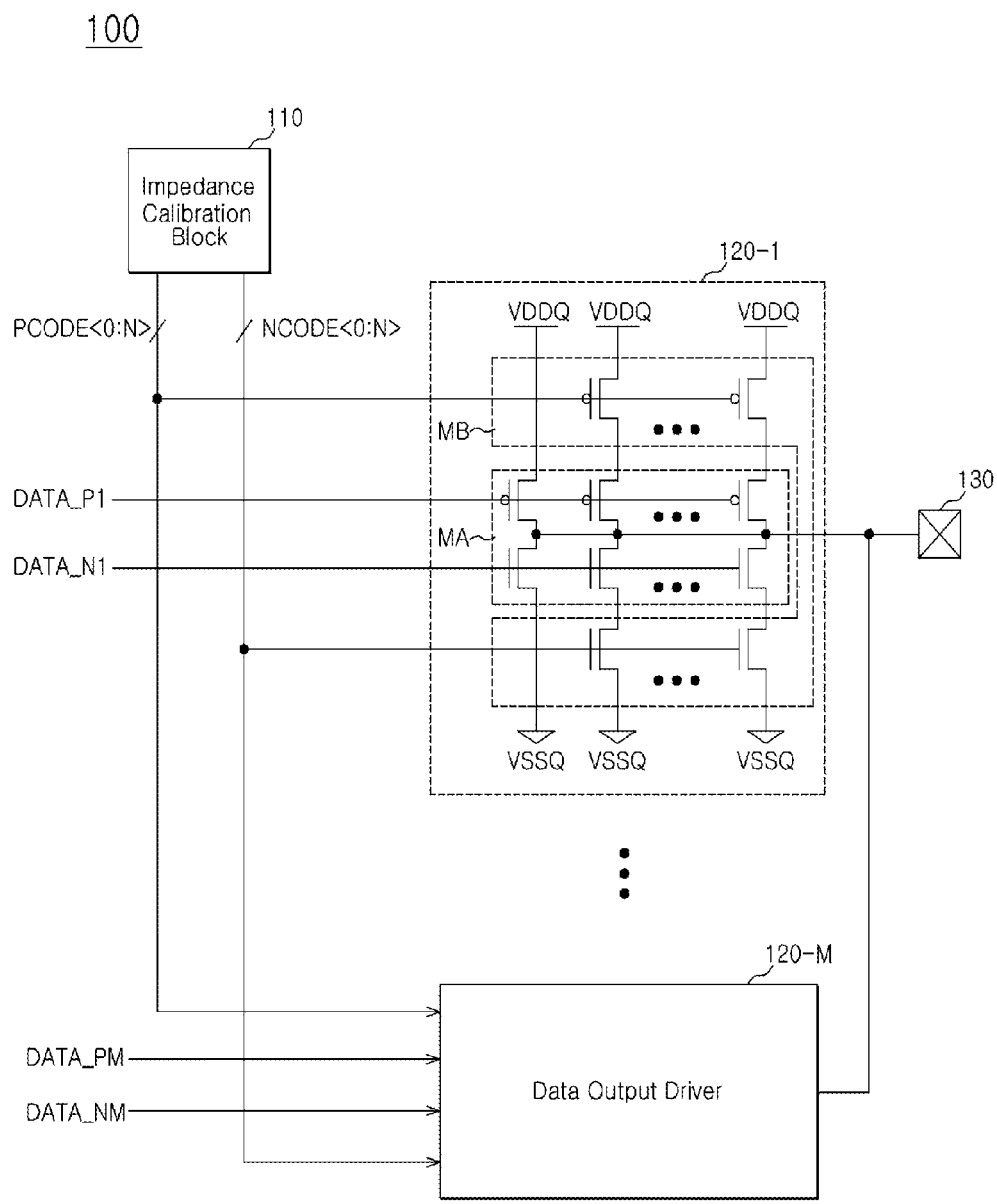
FIG. 1 is a block diagram illustrating a semiconductor circuit in accordance with one embodiment of the present invention.

Advantages and characteristics of the present invention and a method for achieving them will be apparent with reference to embodiments described below in addition to the accompanying drawings. However, the present invention is not limited to the exemplary embodiments described below but may be implemented in various forms. Therefore, the exemplary embodiments are provided to enable those skilled in the art to thoroughly understand the teaching of the present invention and to completely inform the scope of the present invention and the exemplary embodiment is just defined by the scope of the appended claims. Throughout the specification, like elements refer to like reference numerals.

Referring to FIG. 1, a semiconductor circuit 100 in accordance with one embodiment of the present invention includes an impedance calibration block 110 and a plurality of data output drivers 120-1 through 120-M.

The output terminals of the plurality of data output drivers 120-1 through 120-M are commonly connected to a signal input/output terminal, that is, a pad 130.

The plurality of data output drivers 120-1 through 120-M may be configured in a similar manner, and each may include a plurality of transistors.

The plurality of transistors are divided into a first transistor group MA and a second transistor group MB.

The first transistor group MA may be configured to receive data DATA_P1/DATA_N1 through DATA_PM/DATA_NM through the gates thereof.

The second transistor group MB may be configured to receive first code signals PCODE<0:N> and NCODE<0:N> through the gates thereof and apply a power supply voltage VDDQ or a ground voltage VSSQ to the first transistor group MA in response to the first code signals PCODE<0:N> and NCODE<0:N>.

The plurality of data output drivers 120-1 through 120-M are determined by their impedances according to the first code signals PCODE<0:N> and NCODE<0:N>, and drive the pad 130 to levels corresponding to the data DATA_P1/DATA_N1 through DATA_PM/DATA_NM.

The impedance calibration block 110 calibrates the first code signals PCODE<0:N> and NCODE<0:N> such that the output voltage of drivers modeled in a similar way as the plurality of data output drivers 120-1 through 120-M corresponds to a reference voltage, that is, a ZQ calibration operation.

The impedance calibration block 110 may operate during an initialization interval of the semiconductor circuit 100. That is, the first code signals PCODE<0:N> and NCODE<0:N> may not be calibrated during a normal operation interval after the initialization of the semiconductor circuit 100.

Of course, calibrating the first code signals PCODE<0:N> and NCODE<0:N> may be performed in response to a separate command.

Figure 2:
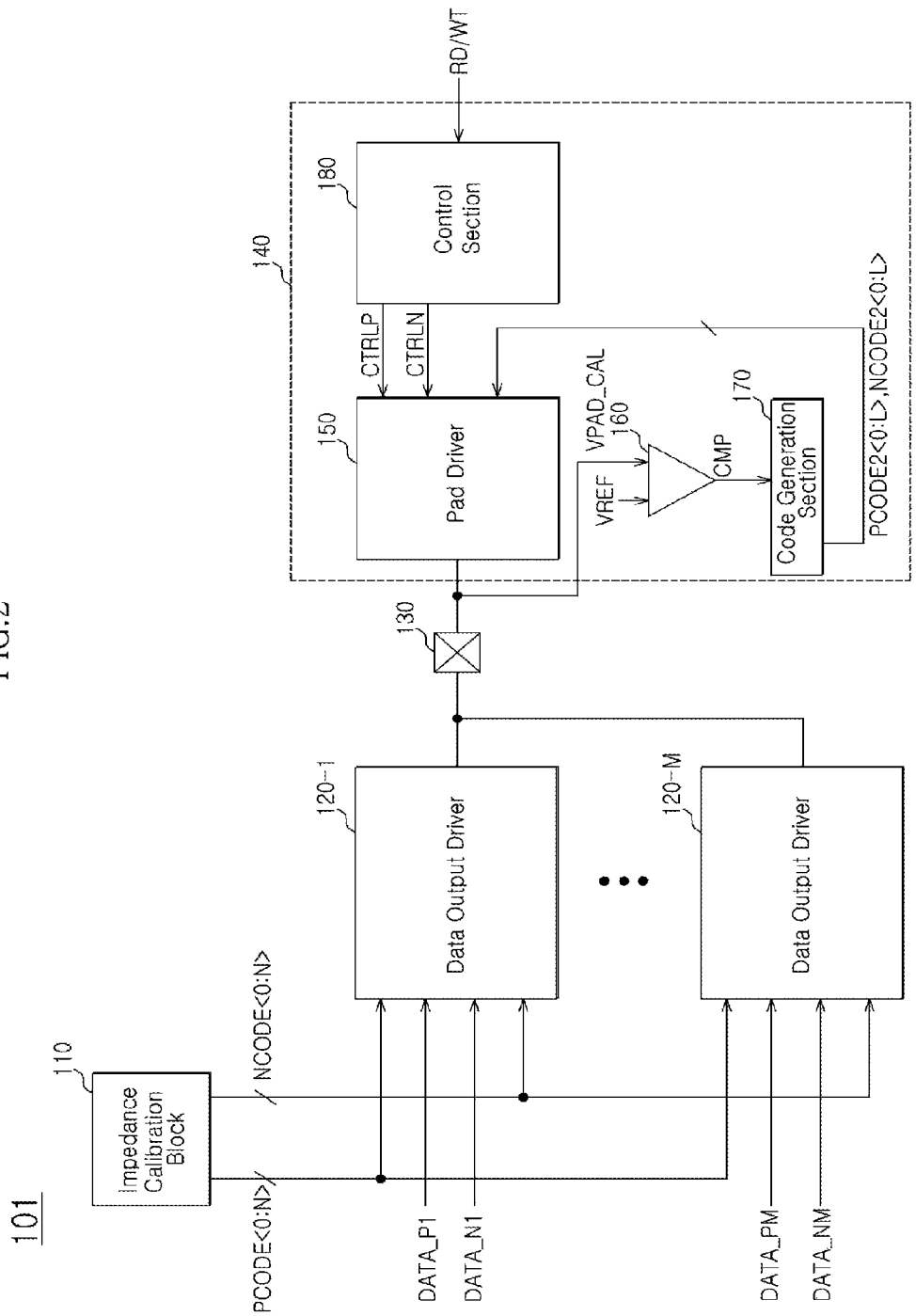
FIG. 2 is a block diagram illustrating a semiconductor circuit in accordance with one embodiment of the present invention.

Referring to FIG. 2, a semiconductor circuit 101 in accordance with one embodiment of the present invention includes an impedance calibration block 110, a plurality of data output drivers 120-1 through 120-M, and an impedance compensation unit 140.

The impedance calibration block 110 and the plurality of data output drivers 120-1 through 120-M may be implemented in a manner similar to the embodiment of the present invention shown in FIG. 1.

The output terminals of the plurality of data output drivers 120-1 through 120-M are commonly connected to a pad 130.

The impedance compensation unit 140 includes a pad driver 150, a comparison section 160, a code generation section 170, and a control section 180.

The pad driver 150 may be configured to calibrate the impedance of the pad 130 in response to control signals CTRLP and CTRLN and second code signals PCODE2<0:L> and NCODE2<0:L>.

The pad driver 150 is connected to the pad 130 and may be implemented in a manner similar to the plurality of data output drivers 120-1 through 120-M.

The pad driver 150 may comprise a plurality of transistors designed to have a different size and a different number from the transistors constituting the plurality of data output drivers 120-1 through 120-M, depending on a unit impedance calibration amount. In other words, the transistors of the pad driver 150 may be designed to have a relatively small size and a decreased number when compared to the transistors of the plurality of data output drivers 120-1 through 120-M.

The comparison section 160 may be configured to compare a reference voltage VREF and a calibrated pad voltage VPAD_CAL calibrated by the pad driver 150 and generate a comparison signal CMP.

The reference voltage VREF may be, for example, one half of a power supply voltage VDDQ, that is, VDDQ/2.

For example, the comparison section 160 may be configured to output the comparison signal CMP of a high level when the calibrated pad voltage VPAD_CAL is higher than the reference voltage VREF.

The code generation section 170 may be configured to increase or decrease the second code signals PCODE2<0:L> and NCODE2<0:L> in response to the comparison signal CMP.

The code generation section 170 may be implemented using a counter.

The control section 180 may be configured to generate the control signals CTRLP and CTRLN in response to a read/write indication signal RD/WT.

The read/write indication signal RD/WT may be a signal which distinguishes between a write operation interval of the semiconductor circuit 101, that is, a data input operation interval, and a read operation interval of the semiconductor circuit 101, that is, a data output operation interval. For example, the read/write indication signal RD/WT may have a high level in the read operation interval of the semiconductor circuit 101 and a low level in the write operation interval of the semiconductor circuit 101.

Figure 3:
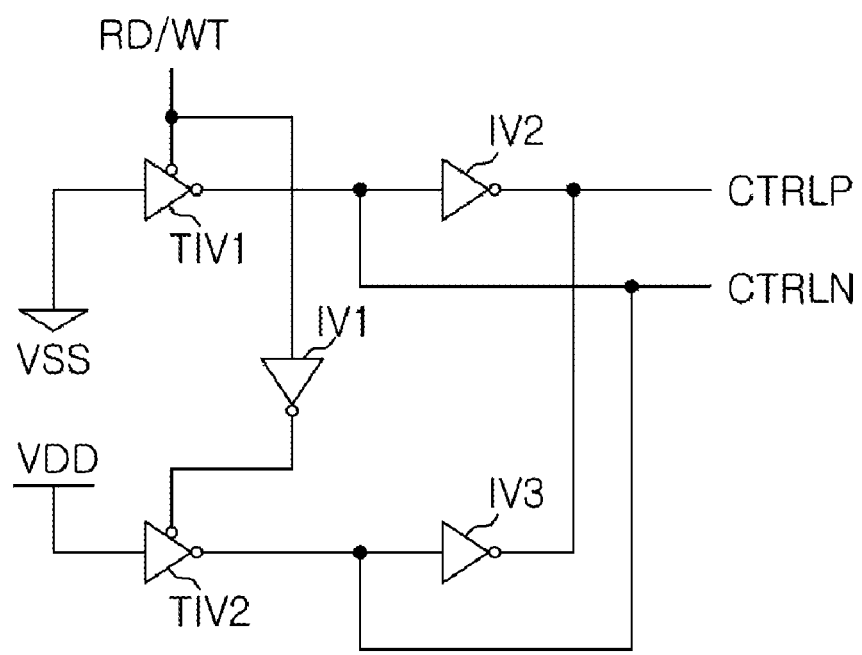
FIG. 3 is a circuit diagram of a control section shown in FIG. 2.

As shown in FIG. 3, the control section 180 may be configured to generate the control signals CTRLP and CTRLN which have opposite phases during the read operation interval and the write operation interval of the semiconductor circuit 101.

FIG. 3 shows an example in which a circuit is configured in a manner that the control signals CTRLP and CTRLN are generated to respectively have a high level and a low level in the read operation interval of the semiconductor circuit 101 and to respectively have a low level and a high level in the write operation interval of the semiconductor circuit 101.

The control section 180 may be implemented using a plurality of tri-state inverters TIV1 and TIV2 and a plurality of inverters IV1 through IV3.

Operations of the semiconductor circuit 101 in accordance with one embodiment of the present invention, configured as discussed above, are described with reference to FIGS. 2 and 3.

The operations of the semiconductor circuit 101 in accordance with one embodiment of the present invention are described through an example in which the semiconductor circuit 101 is applied to a semiconductor memory.

The first code signals PCODE<0:N> and NCODE<0:N>, which are generated in the impedance calibration block 110, are supplied to the plurality of data output drivers 120-1 through 120-M.

The impedances of the plurality of data output drivers 120-1 through 120-M may be determined according to the first code signals PCODE<0:N> and NCODE<0:N>.

During the read operation interval of the semiconductor memory, the plurality of data output drivers 120-1 through 120-M perform data output operations by driving the pad 130 to the levels corresponding to the data DATA_P1/DATA_N1 through DATA_PM/DATA_NM.

During the write operation interval of the semiconductor memory, the plurality of data output drivers 120-1 through 120-M perform operations of setting the impedance of the pad 130 to a target impedance and setting the voltage level of the pad 130 to, for example, VDDQ/2.

At this time, the data DATA_P1/DATA_N1 through DATA_PM/DATA_NM are supplied to a high level and a low level.

The data DATA_P1 is supplied at a high level and the data DATA_N1 is supplied at a low level. The other data DATA_P2/DATA_N2 through DATA_PM/DATA_NM may be supplied in a similar manner.

Accordingly, referring to FIG. 1, all of the transistors of the first transistor groups MA of the plurality of data output drivers 120-1 through 120-M are turned on and operate in such a way as to apply the voltage level VDDQ/2, corresponding to one half of the power supply voltage VDDQ, to the pad 130.

In order to improve write operation performance, that is, data input efficiency, the voltage level of the pad 130 should correspond to VDDQ/2.

However, since the voltage level of the pad 130 is calibrated using the first code signals PCODE<0:N> and NCODE<0:N>, which are generated through the impedance calibration block 110 not directly connected to the pad 130, the actual voltage level of the pad 130 may be different from the target voltage level VDDQ/2.

Therefore, the impedance compensation unit 140 calibrates the voltage level of the pad 130 such that the voltage level of the pad 130 can substantially correspond to the target voltage level VDDQ/2.

The pad driver 150, which is directly connected to the pad 130, calibrates the voltage of the pad 130 according to the second code signals PCODE2<0:L> and NCODE2<0:L>.

The comparison section 160 compares the reference voltage VREF and the calibrated pad voltage VPAD_CAL calibrated by the pad driver 150 and outputs the comparison signal CMP of a high level or a low level.

The code generation section 170 increases or decreases the code values of the second code signals PCODE2<0:L> and NCODE2<0:L> in response to the comparison signal CMP.

The control section 180 generates the control signals CTRLP and CTRLN such that the pad driver 150 may calibrate the voltage level of the pad 130 during the write operation interval in response to the read/write indication signal RD/WT.

That is to say, the read/write signal RD/WT has a low level during the write operation interval.

Accordingly, referring to FIG. 3, the control section 180 outputs the control signals CTRLP and CTRLN at a low level and a high level, respectively, during the write operation interval.

The pad driver 150 may be configured by modeling the data output driver 120-1 shown in FIG. 1. The control signals CTRLP and CTRLN are inputted to the first transistor group MA of the pad driver 150 in place of the data DATA_P1 and DATA_N1.

Also, the second code signals PCODE2<0:L> and NCODE2<0:L> are inputted to the second transistor group MB of the pad driver 150 in place of the first code signals PCODE<0:N> and NCODE<0:N>.

Thus, the pad driver 150 calibrates the voltage level of the pad 130 to be substantially the same level as the reference voltage VREF according to the second code signals PCODE2<0:L> and NCODE2<0:L>, which are calibrated by directly reflecting a change in the voltage level of the pad 130, during the write operation interval.

Meanwhile, the read/write indication signal RD/WT has a high level during the read operation interval. Hence, referring to FIG. 3, the control section 180 outputs the control signals CTRLP and CTRLN at a high level and a low level, respectively, during the read operation interval.

All of the transistors of the first transistor group MA of the pad driver 150 are turned off in response to the control signals CTRLP and CTRLN of the high level and the low level and are electrically isolated from the pad 130.

Therefore, the pad driver 150 does not have any influence on the voltage level of the pad 130 during the read operation interval.

As described above, the size of the transistors of the pad driver 150 is designed to be smaller than that of the transistors of the plurality of data output drivers 120-1 through 120-M.

Consequently, the impedance compensation unit 140 may compensate for a difference between the impedance of the pad 130 calibrated by the plurality of data output drivers 120-1 through 120-M and the target impedance by calibrating the impedance of the pad 130 to a higher resolution when compared to the plurality of data output drivers 120-1 through 120-M.

Figure 4:
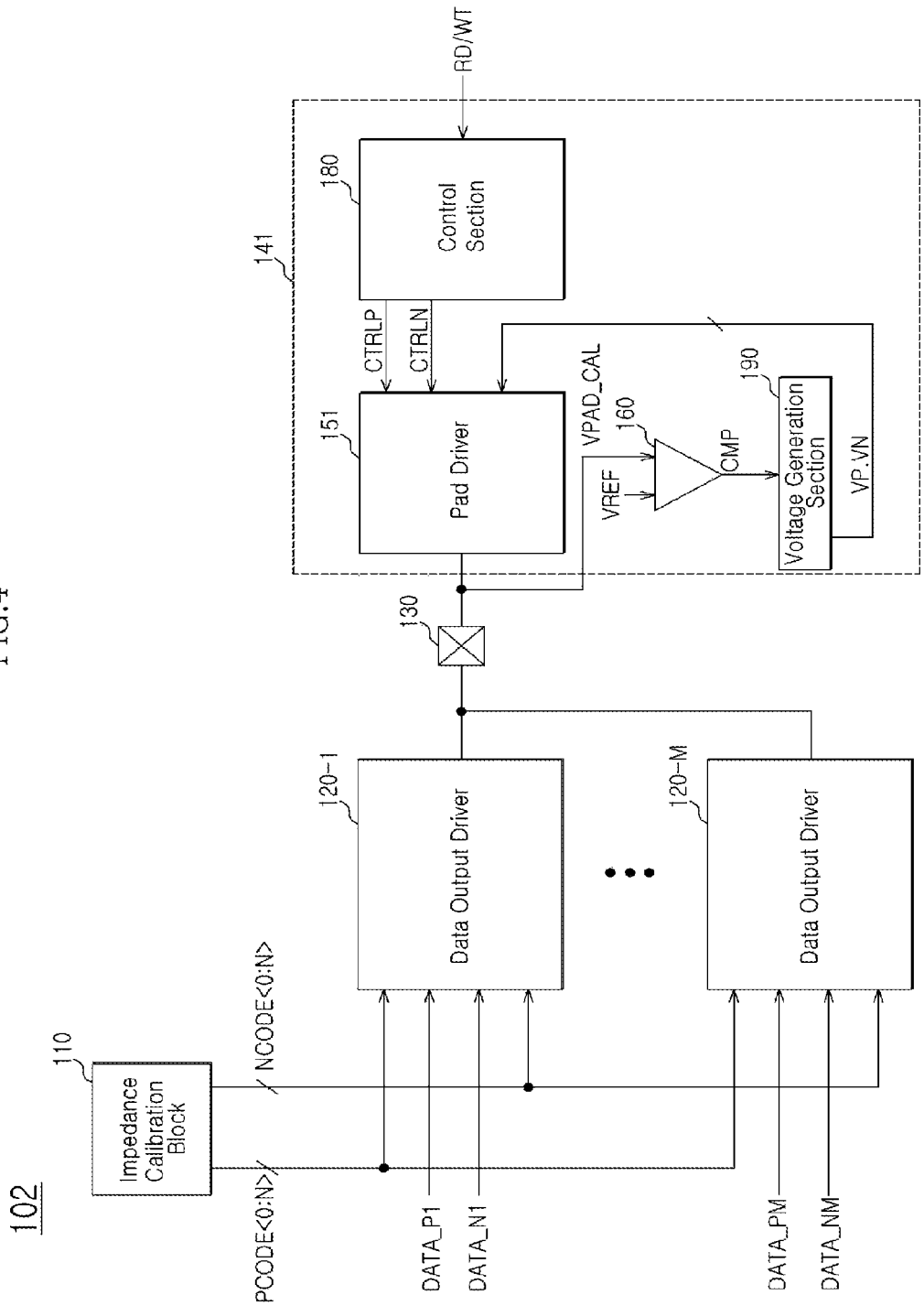
FIG. 4 is a block diagram illustrating a semiconductor circuit in accordance with one embodiment of the present invention.

Referring to FIG. 4, a semiconductor circuit 102 in accordance with one embodiment of the present invention includes an impedance calibration block 110, a plurality of data output drivers 120-1 through 120-M, and an impedance compensation unit 141.

The impedance calibration block 110 and the plurality of data output drivers 120-1 through 120-M may be implemented in a similar manner as the embodiment shown in FIG. 1.

The impedance compensation unit 141 includes a pad driver 151, a comparison section 160, a control section 180, and a voltage generation section 190.

The comparison section 160 and the control section 180 may be implemented in a similar manner as the embodiment shown in FIG. 2.

The voltage generation section 190 may be configured to generate control voltages VP and VN which are linearly changed according to a comparison signal CMP.

The voltage generation section 190 may comprise a charge pump.

Since the pad driver 151 is implemented in such a way as to control the level of the gates of transistors in response to the control voltages VP and VN, the pad driver 151 may be configured in a simpler manner when compared to the pad driver 150 shown in FIG. 2.

Figure 5:
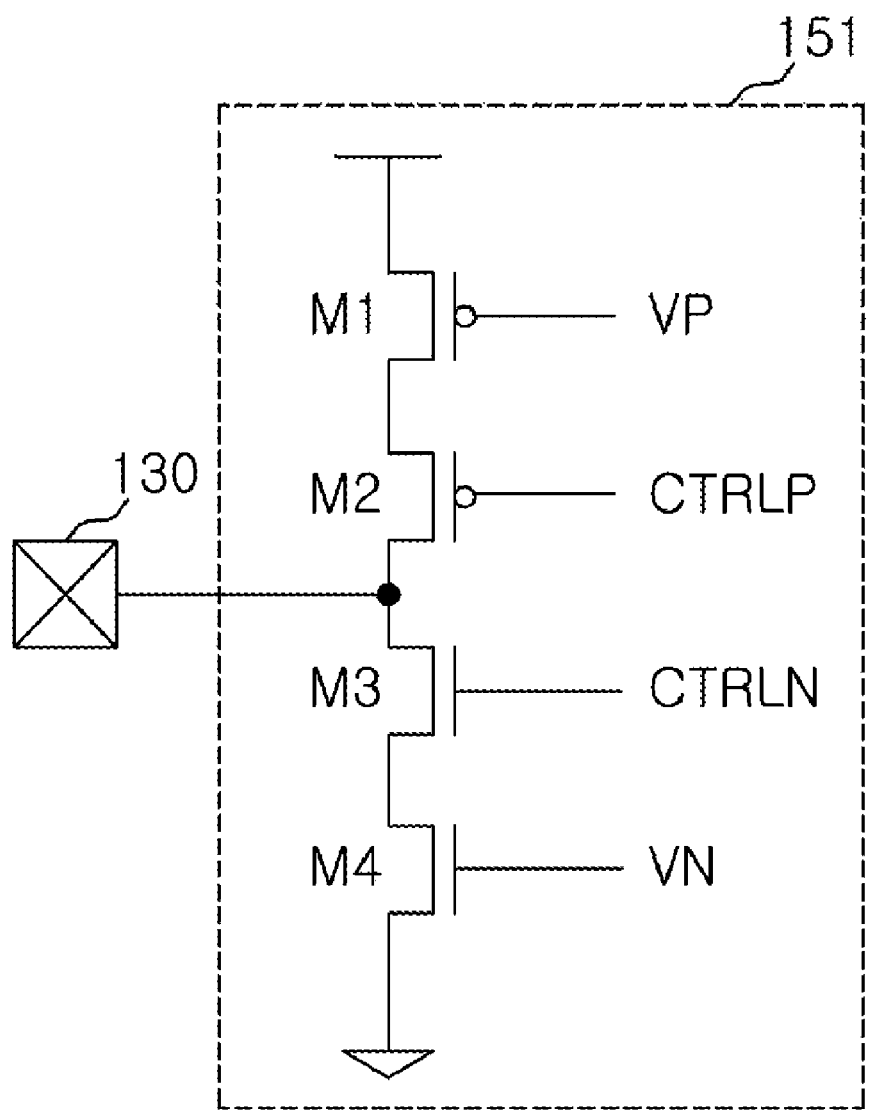
FIG. 5 is a circuit diagram of a pad driver shown in FIG. 4.

Namely, as shown in FIG. 5, the pad driver 151 includes a plurality of transistors M1 through M4 which are connected between a power supply voltage (VDDQ) terminal and a ground voltage (VSSQ) terminal.

The transistor M1 has a gate to which the control voltage VP is applied, the transistor M2 has a gate to which the control signal CTRLP is applied, the transistor M3 has a gate to which the control signal CTRLN is applied, and the transistor M4 has a gate to which the control voltage VN is applied.

A pad 130 is connected to the drain of the transistor M2 and the drain of the transistor M3.

Operations of the semiconductor circuit 102 in accordance with one embodiment of the present invention, configured as discussed above, are described below.

Operations of the impedance calibration block 110 and the plurality of data output drivers 120-1 through 120-M may be as described with respect to the operations of the semiconductor circuit 101 in accordance with one embodiment of the present invention.

The impedance compensation unit 141 may calibrate the voltage level of the pad 130 such that a difference between the voltage level of the pad 130 and a target voltage level VDDQ/2 decreases.

The pad driver 151, which is directly connected to the pad 130, calibrates the voltage of the pad 130 according to the control voltages VP and VN.

The comparison section 160 compares a reference voltage VREF and a calibrated pad voltage VPAD_CAL calibrated by the pad driver 151 and outputs the comparison signal CMP of a high level or a low level.

The voltage generation section 190 calibrates the levels of the control voltages VP and VN by performing charging/discharging according to the comparison signal CMP.

The control section 180 generates the control signals CTRLP and CTRLN such that the pad driver 151 may calibrate the voltage level of the pad 130 during the write operation interval in response to the read/write indication signal RD/WT.

The read/write signal RD/WT has a low level during the write operation interval. Accordingly, referring to FIG. 3, the control section 180 outputs the control signals CTRLP and CTRLN at a low level and a high level, respectively, during the write operation interval.

The pad driver 151 calibrates the voltage level of the pad 130 to substantially the same level as the reference voltage VREF, within an error range according to the control voltages VP and VN which are calibrated by directly reflecting a change in the voltage level of the pad 130, during the write operation interval.

Meanwhile, the read/write indication signal RD/WT has a high level during the read operation interval. Hence, referring to FIG. 3, the control section 180 outputs the control signals CTRLP and CTRLN at a high level and a low level, respectively, during the read operation interval.

The transistors M2 and M3 of the pad driver 151 are turned off in response to the control signals CTRLP and CTRLN of the high level and the low level, and are electrically isolated from the pad 130.

Therefore, the pad driver 151 does not have any influence on the voltage level of the pad 130 during the read operation interval.

As described above, the size of the transistors M1 through M4 of the pad driver 151 is designed to be smaller than that of the transistors of the plurality of data output drivers 120-1 through 120-M.

Consequently, the impedance compensation unit 141 may compensate for a difference between the impedance of the pad 130 calibrated by the plurality of data output drivers 120-1 through 120-M and the target impedance by calibrating the impedance of the pad 130 differently from the plurality of data output drivers 120-1 through 120-M. Calibrating may be performed using an analog method.

Figure 6:
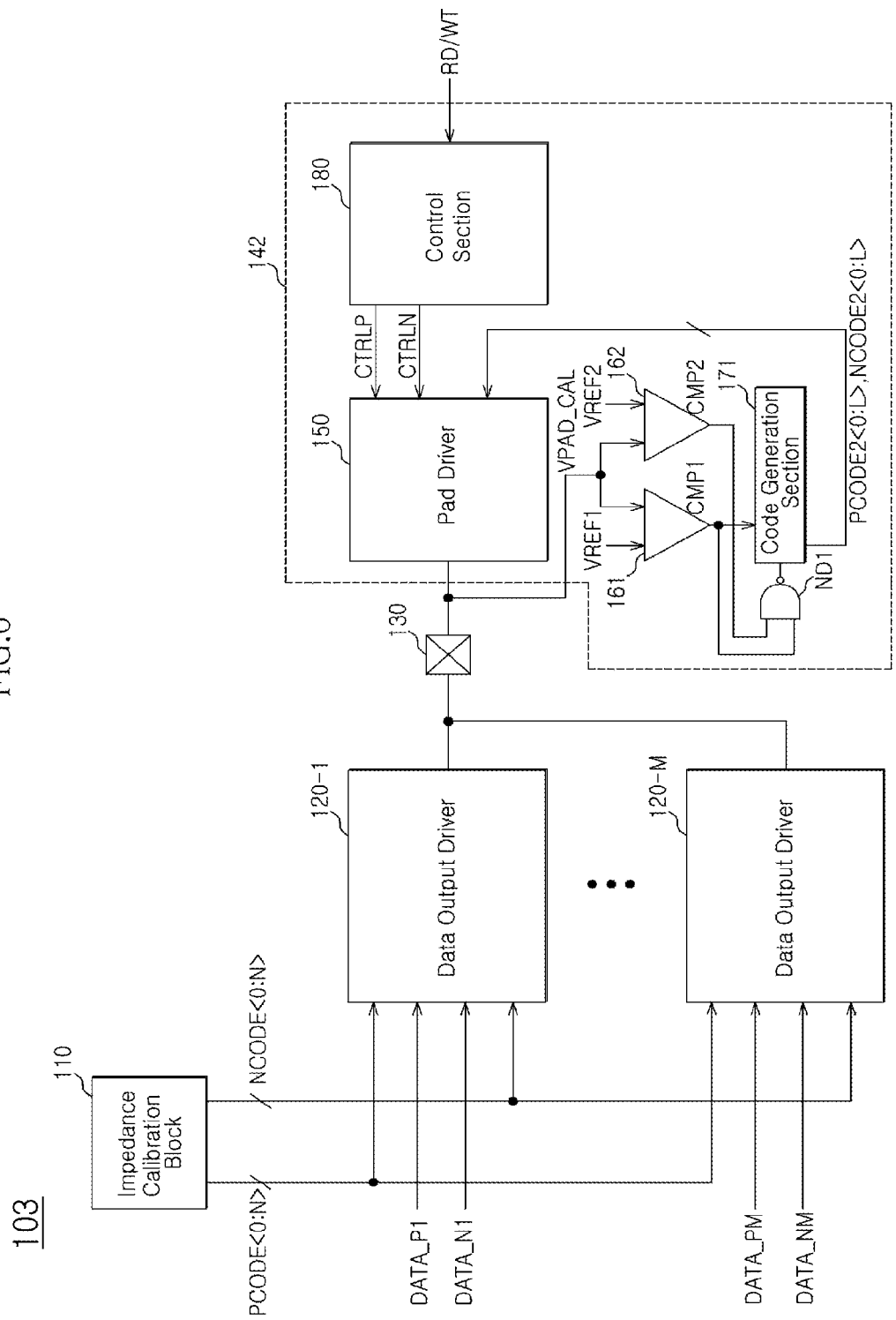
FIG. 6 is a block diagram illustrating a semiconductor circuit in accordance with one embodiment of the present invention.

Referring to FIG. 6, a semiconductor circuit 103 in accordance with one embodiment of the present invention includes an impedance calibration block 110, a plurality of data output drivers 120-1 through 120-M, and an impedance compensation unit 142.

The impedance calibration block 110 and the plurality of data output drivers 120-1 through 120-M may be implemented in a similar manner as the embodiment shown in FIG. 1.

The impedance compensation unit 142 includes a pad driver 150, first and second comparison sections 161 and 162, a code generation section 171, a NAND gate ND1, and a control section 180.

The pad driver 150 is connected to a pad 130 and may be implemented in a similar manner as shown in FIG. 2.

The control section 180 may be implemented in a similar manner as shown in FIG. 3.

The first comparison section 161 may be configured to compare a first reference voltage VREF1 and a calibrated pad voltage VPAD_CAL calibrated by the pad driver 150 and generate a first comparison signal CMP1.

The second comparison section 162 may be configured to compare a second reference voltage VREF2 and the calibrated pad voltage VPAD_CAL and generate a second comparison signal CMP2.

The first and second reference voltages VREF1 and VREF2 may be set to be respectively higher and lower than VDDQ/2, or vice versa. Differences between the first reference voltage VREF1 and VDDQ/2 and between the second reference voltage VREF2 and VDDQ/2 may vary depending on a circuit design.

For example, the first and second comparison sections 161 and 162 may be configured to output first and second comparison signals CMP1 and CMP2 commonly having a high level or a low level when the calibrated pad voltage VPAD_CAL has a level between the first reference voltage VREF1 and the second reference voltage VREF2.

The code generation section 171 may be implemented using a counter.

The code generation section 171 may be configured to increase or decrease second code signals PCODE2<0:L> and NCODE2<0:L> in response to the first comparison signal CMP1.

Also, the code generation section 171 may be configured to fix the code values of the second code signals PCODE2<0:L> and NCODE2<0:L> according to a low level signal generated by the NAND gate ND1 when the first and second comparison signals CMP1 and CMP2 have the same level, for example, a high level.

Currently, because it is difficult to make the first reference voltage VREF1 and the calibrated pad voltage VPAD_CAL correspond to each other, the first comparison signal CMP1 repeatedly has a high level and a low level.

Thus, in the semiconductor circuit 103 in accordance with one embodiment of the present invention, the impedance compensation unit 142 is configured such that the code generation section 171 interrupts the operation of calibrating the second code signals PCODE2<0:L> and NCODE2<0:L> when the calibrated pad voltage VPAD_CAL has substantially the same level as VDDQ/2, that is, a level between the first reference voltage VREF1 and the second reference voltage VREF2.

Operations of the semiconductor circuit 103 in accordance with one embodiment of the present invention, configured as discussed above, are described below.

Operations of the impedance calibration block 110 and the plurality of data output drivers 120-1 through 120-M may be as described with respect to the operations of the semiconductor circuit 101 in accordance with one embodiment of the present invention.

The impedance compensation unit 142 may calibrate the voltage level of the pad 130 such that the voltage level of the pad 130 is substantially the same as the target voltage level VDDQ/2.

The pad driver 150, which is directly connected to the pad 130, calibrates the voltage of the pad 130 according to the second code signals PCODE2<0:L> and NCODE2<0:L>.

The first comparison section 161 compares the first reference voltage VREF1 and the calibrated pad voltage VPAD_CAL and outputs the first comparison signal CMP1 of a high level or a low level.

The code generation section 171 increases or decreases the code values of the second code signals PCODE2<0:L> and NCODE2<0:L> according to the first comparison signal CMP1.

If the calibrated pad voltage VPAD_CAL has substantially the same level as VDDQ/2, that is, a level between the first reference voltage VREF1 and the second reference voltage VREF2, both the first comparison signal CMP1 and the second comparison signal CMP2 have a high level.

Since both the first comparison signal CMP1 and the second comparison signal CMP2 have the high level, the NAND gate ND1 outputs a signal of a low level.

The code generation section 171 fixes the second code signals PCODE2<0:L> and NCODE2<0:L> to current code values in response to the low level signal outputted from the NAND gate ND1.

Since the second code signals PCODE2<0:L> and NCODE2<0:L> are fixed, current consumption by the pad driver 150 is reduced.

The control section 180 generates the control signals CTRLP and CTRLN such that the pad driver 150 may calibrate the voltage level of the pad 130 only during the write operation interval in response to the read/write indication signal RD/WT.

The read/write signal RD/WT may have a low level during the write operation interval. Accordingly, referring to FIG. 3, the control section 180 outputs the control signals CTRLP and CTRLN at a low level and a high level, respectively, during the write operation interval.

The pad driver 150 may be configured by modeling the data output driver 120-1 shown in FIG. 1. The control signals CTRLP and CTRLN are inputted to the first transistor group MA of the pad driver 150, in place of the data DATA_P1 and DATA_N1.

Also, the second code signals PCODE2<0:L> and NCODE2<0:L> are inputted to the second transistor group MB of the pad driver 150 in place of the first code signals PCODE<0:N> and NCODE<0:N>.

Thus, the pad driver 150 calibrates the voltage level of the pad 130 to substantially the same level as VDDQ/2, within an error range according to the second code signals PCODE2<0:L> and NCODE2<0:L> which are calibrated by directly reflecting a change in the voltage level of the pad 130, during the write operation interval.

Meanwhile, the read/write indication signal RD/WT has a high level during the read operation interval. Hence, referring to FIG. 3, the control section 180 outputs the control signals CTRLP and CTRLN at a high level and a low level, respectively, during the read operation interval.

All of the transistors of the first transistor group MA of the pad driver 150 are turned off in response to the control signals CTRLP and CTRLN of the high level and the low level and are electrically isolated from the pad 130.

Therefore, the pad driver 150 does not have any influence on the voltage level of the pad 130 during the read operation interval.

Consequently, the impedance compensation unit 142 may compensate for a difference between the impedance of the pad 130 calibrated by the plurality of data output drivers 120-1 through 120-M and the target impedance by calibrating the impedance of the pad 130 to a higher resolution when compared to the plurality of data output drivers 120-1 through 120-M.

Moreover, in the semiconductor circuit 103 in accordance with one embodiment of the present invention, the current paths of the pad driver 150 may be blocked to reduce current consumption when any one of two conditions, the output of the NAND gate ND1 has a low level and the respective control signals CTRLP and CTRLN have a high level and a low level, is satisfied.

Figure 7:
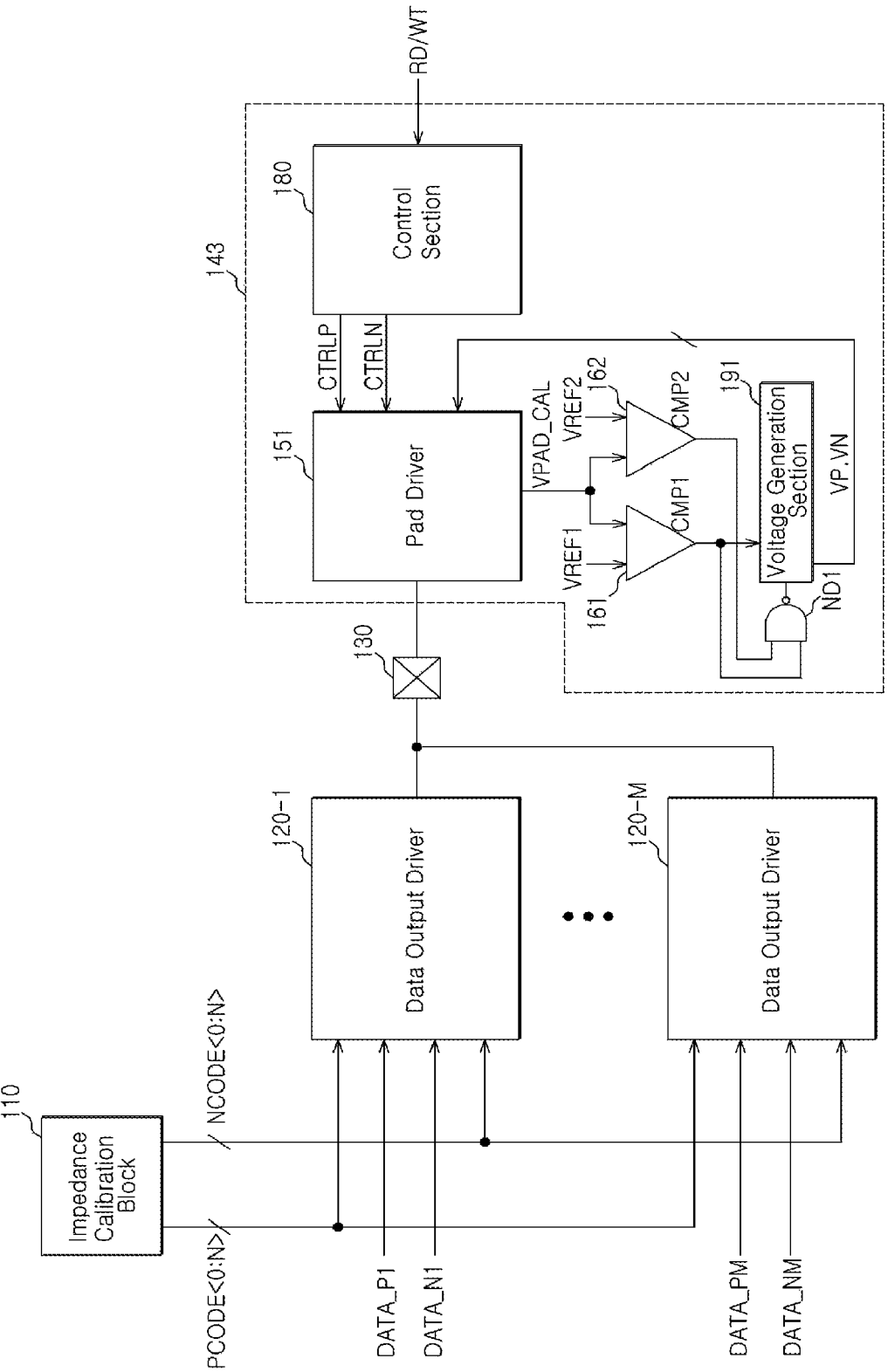
FIG. 7 is a block diagram illustrating a semiconductor circuit in accordance with one embodiment of the present invention.

Referring to FIG. 7, a semiconductor circuit 104 in accordance with one embodiment of the present invention includes an impedance calibration block 110, a plurality of data output drivers 120-1 through 120-M, and an impedance compensation unit 143.

The impedance calibration block 110 and the plurality of data output drivers 120-1 through 120-M may be implemented in a similar manner as the embodiment of the present invention shown in FIG. 1.

The impedance compensation unit 143 may include a pad driver 151, first and second comparison sections 161 and 162, a voltage generation section 191, a NAND gate ND1, and a control section 180.

The pad driver 151 may be implemented in a similar manner as shown in FIG. 5.

The control section 180 may be implemented in a similar manner as shown in FIG. 3.

The first comparison section 161 and the second comparison section 162 may be implemented in a similar manner as shown in FIG. 6.

First and second reference voltages VREF1 and VREF2 may be set to be respectively higher and lower than VDDQ/2, or vice versa. Differences between the first reference voltage VREF1 and VDDQ/2 and between the second reference voltage VREF2 and VDDQ/2 may vary depending on a circuit design.

For example, the first and second comparison sections 161 and 162 may be configured to output first and second comparison signals CMP1 and CMP2 commonly having a high level or a low level when a calibrated pad voltage VPAD_CAL has a level between the first reference voltage VREF1 and the second reference voltage VREF2.

The voltage generation section 191 may comprise a charge pump.

The voltage generation section 191 may be configured to generate control voltages VP and VN which are linearly changed according to the first comparison signal CMP1.

Also, the voltage generation section 191 may be configured to block charging/discharging paths according to a low level signal generated by the NAND gate ND1 and maintain the levels of the control voltages VP and VN when the first and second comparison signals CMP1 and CMP2 have the same level, for example, a high level.

Currently, because it is difficult to make the first reference voltage VREF1 and the calibrated pad voltage VPAD_CAL correspond to each other, the first comparison signal CMP1 repeatedly has a high level and a low level.

Thus, in the semiconductor circuit 104 in accordance with one embodiment of the present invention, the impedance compensation unit 143 may be configured such that the voltage generation section 191 interrupts the operation of calibrating the control voltages VP and VN when the calibrated pad voltage VPAD_CAL has substantially the same level as VDDQ/2, that is, a level between the first reference voltage VREF1 and the second reference voltage VREF2.

Operations of the semiconductor circuit 104 in accordance with one embodiment of the present invention, configured as discussed above, are described below.

Operations of the impedance calibration block 110 and the plurality of data output drivers 120-1 through 120-M may be as described with respect to the operations of the semiconductor circuit 101 in accordance with one embodiment of the present invention.

The impedance compensation unit 143 may calibrate the voltage level of the pad 130 such that the voltage level of the pad 130 is substantially the same as the target voltage level VDDQ/2.

The pad driver 151, which is directly connected to the pad 130, calibrates the voltage of the pad 130 according to the control voltages VP and VN.

The first comparison section 161 compares the first reference voltage VREF1 and the calibrated pad voltage VPAD_CAL and outputs the first comparison signal CMP1 of a high level or a low level.

The voltage generation section 191 increases or decreases the levels of the control voltages VP and VN according to the first comparison signal CMP1.

If the calibrated pad voltage VPAD_CAL has substantially the same level as VDDQ/2, that is, a level between the first reference voltage VREF1 and the second reference voltage VREF2, both the first comparison signal CMP1 and the second comparison signal CMP2 have a high level.

Since both the first comparison signal CMP1 and the second comparison signal CMP2 have the high level, the NAND gate ND1 outputs a signal of a low level.

The voltage generation section 191 fixes the control voltages VP and VN to current levels in response to the low level signal outputted from the NAND gate ND1.

Since the levels of the control voltages VP and VN are prevented from changing, current consumption by the pad driver 151 is reduced.

The control section 180 generates the control signals CTRLP and CTRLN such that the pad driver 151 calibrates the voltage level of the pad 130 during the write operation interval in response to the read/write indication signal RD/WT.

The read/write signal RD/WT may have a low level during the write operation interval. Accordingly, referring to FIG. 3, the control section 180 outputs the control signals CTRLP and CTRLN at a low level and a high level, respectively, during the write operation interval.

Thus, the pad driver 151 calibrates the voltage level of the pad 130 to substantially the same level as VDDQ/2, within an error range according to the control voltages VP and VN which are calibrated by directly reflecting a change in the voltage level of the pad 130, during the write operation interval.

Meanwhile, the read/write indication signal RD/WT has a high level during the read operation interval. Hence, referring to FIG. 3, the control section 180 outputs the control signals CTRLP and CTRLN at a high level and a low level, respectively, during the read operation interval.

All of the transistors of the first transistor group MA of the pad driver 151 are turned off in response to the control signals CTRLP and CTRLN of the high level and the low level, and are electrically isolated from the pad 130.

Therefore, the pad driver 151 does not have any influence on the voltage level of the pad 130 during the read operation interval.

Consequently, the impedance compensation unit 143 may compensate for a difference between the impedance of the pad 130 calibrated by the plurality of data output drivers 120-1 through 120-M and the target impedance by calibrating the impedance of the pad 130 differently from the plurality of data output drivers 120-1 through 120-M. Calibrating may be performed using an analog method.

Moreover, in the semiconductor circuit 104 in accordance with one embodiment of the present invention, the current paths of the pad driver 151 may be blocked to reduce current consumption when any one of two conditions, the output of the NAND gate ND1 has a low level and the respective control signals CTRLP and CTRLN have a high level and a low level, is satisfied.

While certain embodiments have been described above, it will be understood to those skilled in the art that the embodiments described are by way of example only. Accordingly, the semiconductor circuit described herein should not be limited based on the described embodiments. Rather, the semiconductor circuit described herein should only be limited in light of the claims that follow when taken in conjunction with the above description and accompanying drawings.

What is claimed is:

1. A semiconductor circuit comprising:
   a pad for signal input/output;
   a pad driver connected to the pad at an output terminal thereof and configured to calibrate a voltage of the pad in response to code signals;
   a comparison section configured to compare a reference voltage and the voltage of the pad and generate a comparison signal;
   a code generation section configured to calibrate code values of the code signals in response to the comparison signal;
   a data output driver connected to the pad, and configured to apply a predetermined impedance to the pad according to second code signals; and
   an impedance calibration block configured to calibrate the second code signals such that an output voltage of an driver modeled in a similar way as the data output driver corresponds to a predetermined reference voltage.

2. The semiconductor circuit according to claim 1, further comprising:
   a control section configured to generate control signals for electrically isolating the pad driver from the pad during a write operation interval.

3. The semiconductor circuit according to claim 1, wherein the code generation section comprises a counter.

4. A semiconductor circuit comprising:
   a pad for signal input/output;
   a pad driver connected to the pad at an output terminal thereof and configured to calibrate a voltage of the pad in response to code signals;
   a first comparison section configured to compare a first reference voltage and the voltage of the pad and generate a first comparison signal;
   a second comparison section configured to compare a second reference voltage and the voltage of the pad and generate a second comparison signal;
   a code generation section configured to calibrate code values of the code signals in response to the first comparison signal and fix code values of the code signals in response to the first comparison signal and the second comparison signal;
   a data output driver connected to the pad, and configured to apply a predetermined impedance to the pad according to second code signals; and
   an impedance calibration block configured to calibrate the second code signals such that an output voltage of an driver modeled in a similar way as the data output driver corresponds to a predetermined reference voltage.

5. The semiconductor circuit according to claim 4, further comprising:
   a control section configured to generate control signals for electrically isolating the pad driver from the pad during a write operation interval.

6. The semiconductor circuit according to claim 4, wherein the code generation section is configured to fix the code values of the code signals in response to the first comparison signal and the second comparison signal which are generated when the voltage of the pad has a level between the first reference voltage and the second reference voltage.

7. The semiconductor circuit according to claim 4, wherein the code generation section comprises a counter.

8. A semiconductor circuit comprising:
a pad for signal input/output;
a pad driver connected to the pad at an output terminal thereof and configured to calibrate a voltage of the pad in response to control voltages;
a comparison section configured to compare a reference voltage and the voltage of the pad and generate a comparison signal;
a voltage generation section configured to calibrate levels of the control voltages in response to the comparison signal;
a data output driver connected to the pad, and configured to apply a predetermined impedance to the pad according to code signals; and
an impedance calibration block configured to calibrate the code signals such that an output voltage of an driver modeled in a similar way as the data output driver corresponds to a predetermined reference voltage.

9. The semiconductor circuit according to claim 8, further comprising:
a control section configured to generate control signals for electrically isolating the pad driver from the pad during a write operation interval.

10. The semiconductor circuit according to claim 8, wherein the voltage generation section comprises a charge pump.

11. A semiconductor circuit comprising:
a pad for signal input/output;
a pad driver connected to the pad at an output terminal thereof and configured to calibrate a voltage of the pad in response to control voltages;
a first comparison section configured to compare a first reference voltage and the voltage of the pad and generate a first comparison signal;
a second comparison section configured to compare a second reference voltage and the voltage of the pad and generate a second comparison signal;
a voltage generation section configured to calibrate levels of the control voltages in response to the first comparison signal and fix levels of the control voltages in response to the first comparison signal and the second comparison signal;
a data output driver connected to the pad, and configured to apply a predetermined impedance to the pad according to code signals; and
an impedance calibration block configured to calibrate the code signals such that an output voltage of an driver modeled in a similar way as the data output driver corresponds to a predetermined reference voltage.

12. The semiconductor circuit according to claim 11, further comprising:
a control section configured to generate control signals for electrically isolating the pad driver from the pad during a write operation interval.

13. The semiconductor circuit according to claim 11, wherein the voltage generation section is configured to fix the levels of the control voltages in response to the first comparison signal and the second comparison signal which are generated when the voltage of the pad has a level between the first reference voltage and the second reference voltage.

14. The semiconductor circuit according to claim 11, wherein the voltage generation section comprises a charge pump.

15. A semiconductor circuit comprising:
data output drivers configured to apply a predetermined voltage to a pad according to first code signals;
an impedance compensation unit configured to compensate for a difference between a voltage of the pad and a reference voltage using second code signals; and
an impedance calibration block configured to calibrate the first code signals such that an output voltage of an driver modeled in a similar way as the data output drivers corresponds to a predetermined reference voltage.

16. The semiconductor circuit according to claim 15, wherein the impedance compensation unit comprises:
a pad driver connected to the pad at an output terminal thereof and configured to calibrate the voltage of the pad in response to the second code signals;
a comparison section configured to compare the reference voltage and the voltage of the pad and generate a comparison signal; and
a code generation section configured to calibrate code values of the second code signals in response to the comparison signal.

17. The semiconductor circuit according to claim 16, wherein the pad driver is configured to be electrically isolated from the pad in response to control signals.

18. The semiconductor circuit according to claim 17, wherein the impedance compensation unit further comprises:
a control section configured to distinguish the write operation interval of the semiconductor circuit and generate the control signals.

19. The semiconductor circuit according to claim 15, wherein the impedance compensation unit comprises:
a pad driver connected to the pad at an output terminal thereof and configured to calibrate the voltage of the pad in response to the second code signals;
a first comparison section configured to compare a first reference voltage and the voltage of the pad and generate a first comparison signal;
a second comparison section configured to compare a second reference voltage and the voltage of the pad and generate a second comparison signal; and
a code generation section configured to calibrate code values of the second code signals in response to the first comparison signal and fix code values of the second code signals in response to the first comparison signal and the second comparison signal.

20. The semiconductor circuit according to claim 19, wherein the pad driver is configured to be electrically isolated from the pad in response to control signals.

21. The semiconductor circuit according to claim 20, wherein the impedance compensation unit further comprises:
a control section configured to distinguish the write operation interval of the semiconductor circuit and generate the control signals.

22. The semiconductor circuit according to claim 19, wherein the code generation section is configured to fix the code values of the second code signals in response to the first comparison signal and the second comparison signal which are generated when the voltage of the pad has a level between the first reference voltage and the second reference voltage.

23. A semiconductor circuit comprising:
a data output driver configured to apply a predetermined voltage to a pad according to preset code signals;
an impedance compensation unit configured to compensate for a difference between a voltage of the pad and a reference voltage using control voltages; and
an impedance calibration block configured to calibrate the preset code signals such that an output voltage of an driver modeled in a similar way as the data output driver corresponds to a predetermined reference voltage.

24. The semiconductor circuit according to claim 23, wherein the impedance compensation unit comprises:
- a pad driver connected to the pad at an output terminal thereof and configured to calibrate the voltage of the pad in response to the control voltages;
- a comparison section configured to compare the reference voltage and the voltage of the pad and generate a comparison signal; and
- a voltage generation section configured to calibrate levels of the control voltages in response to the comparison signal.

25. The semiconductor circuit according to claim 24, wherein the pad driver is configured to be electrically isolated from the pad in response to control signals.

26. The semiconductor circuit according to claim 25, wherein the impedance compensation unit further comprises:
- a control section configured to distinguish the write operation interval of the semiconductor circuit and generate the control signals.

27. The semiconductor circuit according to claim 23, wherein the impedance compensation unit comprises:
- a pad driver connected to the pad at an output terminal thereof and configured to calibrate the voltage of the pad in response to the control voltages;
- a first comparison section configured to compare a first reference voltage and the voltage of the pad and generate a first comparison signal;
- a second comparison section configured to compare a second reference voltage and the voltage of the pad and generate a second comparison signal; and
- a voltage generation section configured to calibrate levels of the control voltages in response to the first comparison signal and fix levels of the control voltages in response to the first comparison signal and the second comparison signal.

28. The semiconductor circuit according to claim 27, wherein the pad driver is configured to be electrically isolated from the pad in response to control signals.

29. The semiconductor circuit according to claim 28, wherein the impedance compensation unit further comprises:
- a control section configured to distinguish the write operation interval of the semiconductor circuit and generate the control signals.

30. The semiconductor circuit according to claim 27, wherein the voltage generation section is configured to fix the levels of the control voltages in response to the first comparison signal and the second comparison signal which are generated when the voltage of the pad has a level between the first reference voltage and the second reference voltage.

31. A semiconductor circuit comprising:
- a pad for signal input/output;
- one or more data output drivers connected to the pad at respective output terminals thereof and configured to apply a predetermined voltage to the pad during a data write operation interval of the semiconductor circuit;
- an impedance compensation section connected to the pad and configured to compensate for a difference between a voltage of the pad and a reference voltage during the data write operation interval; and
- an impedance calibration block configured to calibrate code signals such that an output voltage of an driver modeled in a similar way as the data output drivers corresponds to a predetermined reference voltage.

32. The semiconductor circuit according to claim 31, wherein the impedance compensation section comprises:
- a pad driver connected to the pad at an output terminal thereof and configured to calibrate a voltage of the pad in response to code signals and be electrically isolated from the pad in response to control signals;
- a comparison section configured to compare a reference voltage and the voltage of the pad and generate a comparison signal;
- a code generation section configured to calibrate code values of the code signals in response to the comparison signal; and
- a control section configured to distinguish a data write operation interval and generate the control signals.

33. The semiconductor circuit according to claim 31, wherein the impedance compensation section comprises:
- a pad driver connected to the pad at an output terminal thereof and configured to calibrate a voltage of the pad in response to code signals and be electrically isolated from the pad in response to control signals;
- a first comparison section configured to compare a first reference voltage and the voltage of the pad and generate a first comparison signal;
- a second comparison section configured to compare a second reference voltage and the voltage of the pad and generate a second comparison signal;
- a code generation section configured to calibrate code values of the code signals in response to the first comparison signal and fix code values of the code signals in response to the first comparison signal and the second comparison signal; and
- a control section configured to distinguish a data write operation interval and generate the control signals.

34. The semiconductor circuit according to claim 31, wherein the impedance compensation section comprises:
- a pad driver connected to the pad at an output terminal thereof and configured to calibrate a voltage of the pad in response to control voltages and be electrically isolated from the pad in response to control signals;
- a comparison section configured to compare a reference voltage and the voltage of the pad and generate a comparison signal;
- a voltage generation section configured to calibrate levels of the control voltages in response to the comparison signal; and
- a control section configured to distinguish a data write operation interval and generate the control signals.

35. The semiconductor circuit according to claim 1, wherein the impedance compensation section comprises:
- a pad driver connected to the pad at an output terminal thereof and configured to calibrate a voltage of the pad in response to control voltages and be electrically isolated from the pad in response to control signals;
- a first comparison section configured to compare a first reference voltage and the voltage of the pad and generate a first comparison signal;
- a second comparison section configured to compare a second reference voltage and the voltage of the pad and generate a second comparison signal;
- a voltage generation section configured to calibrate levels of the control voltages in response to the comparison signal and fix levels of the control voltages in response to the first comparison signal and the second comparison signal; and
- a control section configured to distinguish a data write operation interval and generate the control signals.

* * * * *